United States Patent [19]

Ueda et al.

[11] Patent Number: 5,376,213
[45] Date of Patent: Dec. 27, 1994

[54] PLASMA PROCESSING APPARATUS

[75] Inventors: Yoichi Ueda; Mitsuaki Komino; Koichi Kazama, all of Tokyo, Japan

[73] Assignee: Tokyo Electron Limited, Tokyo, Japan

[21] Appl. No.: 104,475

[22] Filed: Jul. 28, 1993

[30] Foreign Application Priority Data

| Jul. 28, 1992 | [JP] | Japan | 4-220623 |
| Jul. 28, 1992 | [JP] | Japan | 4-220624 |
| Dec. 11, 1992 | [JP] | Japan | 4-353046 |
| Jan. 20, 1993 | [JP] | Japan | 5-26227 |
| Jan. 28, 1993 | [JP] | Japan | 5-32658 |
| Jan. 28, 1993 | [JP] | Japan | 5-32793 |
| Feb. 1, 1993 | [JP] | Japan | 5-37552 |

[51] Int. Cl.$^5$ .............................. C23F 1/02
[52] U.S. Cl. .............................. 156/345
[58] Field of Search .......... 118/723 E, 724; 156/345; 204/298.34

[56] References Cited

U.S. PATENT DOCUMENTS

| 5,078,851 | 1/1992 | Nishihata | 204/298.34 |
| 5,147,497 | 9/1992 | Nozawa | 156/626 |
| 5,223,113 | 6/1993 | Kaneko et al. | 204/298.33 |
| 5,270,266 | 12/1993 | Hirano | 437/228 |
| 5,290,381 | 3/1994 | Nozawa | 156/345 |

Primary Examiner—Robert Kunemund
Assistant Examiner—Joni Y. Chang
Attorney, Agent, or Firm—Oblon, Spivak, McClelland, Maier & Neustadt

[57] ABSTRACT

A plasma etching apparatus includes a wafer-mount arranged in an aluminum-made process chamber. The wafer-mount comprises an aluminum-made susceptor, a heater fixing frame and a cooling block, and a ceramics heater is attached to the heater fixing frame. A bore in which liquid nitrogen is contained is formed in the cooling block. The cold of the cooling block is transmitted to a wafer on the susceptor to cool it while it is being etched. The ceramics heater adjusts the temperature of the wafer cooled. Liquid nitrogen is circulated in the bore in the cooling block, passing through coolant passages defined by a pair of joint devices which connect the bottom of the process chamber and the cooling block to each other. Each of the joint devices includes an upper conductive connector secured to the cooling block, a lower conductive connector secured to the chamber bottom, and an electrical- and thermal-insulating ring for connecting both of the connectors to each other while keeping them electrical- and thermal-insulated.

21 Claims, 9 Drawing Sheets

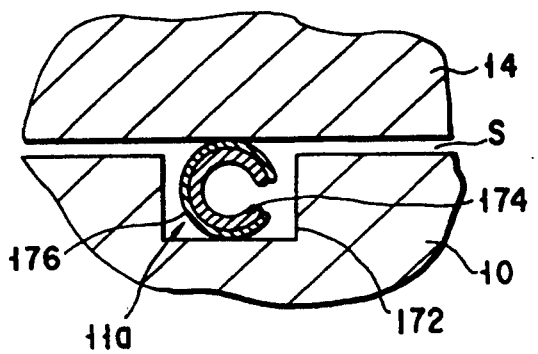
F I G. 6
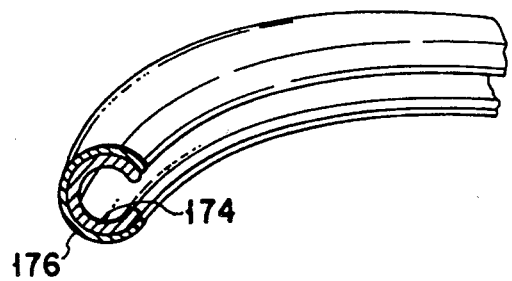
F I G. 7
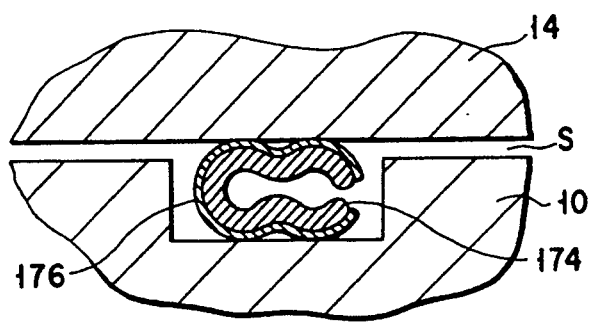
F I G. 8A
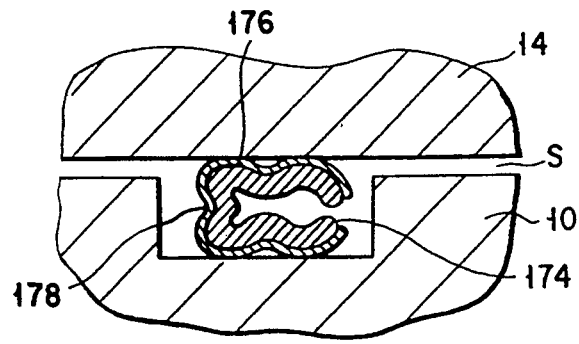
F I G. 8B

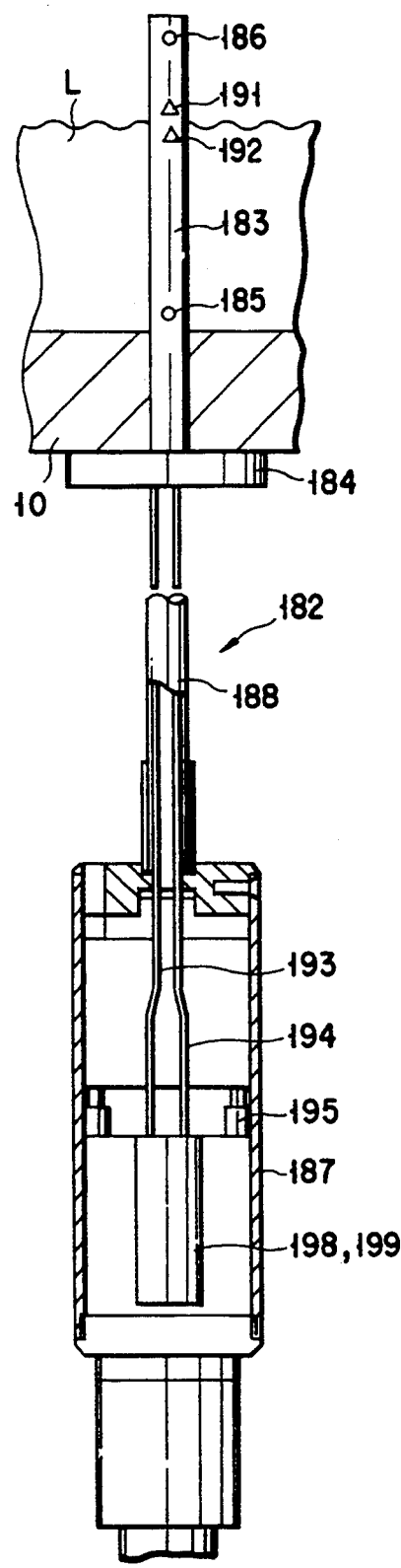 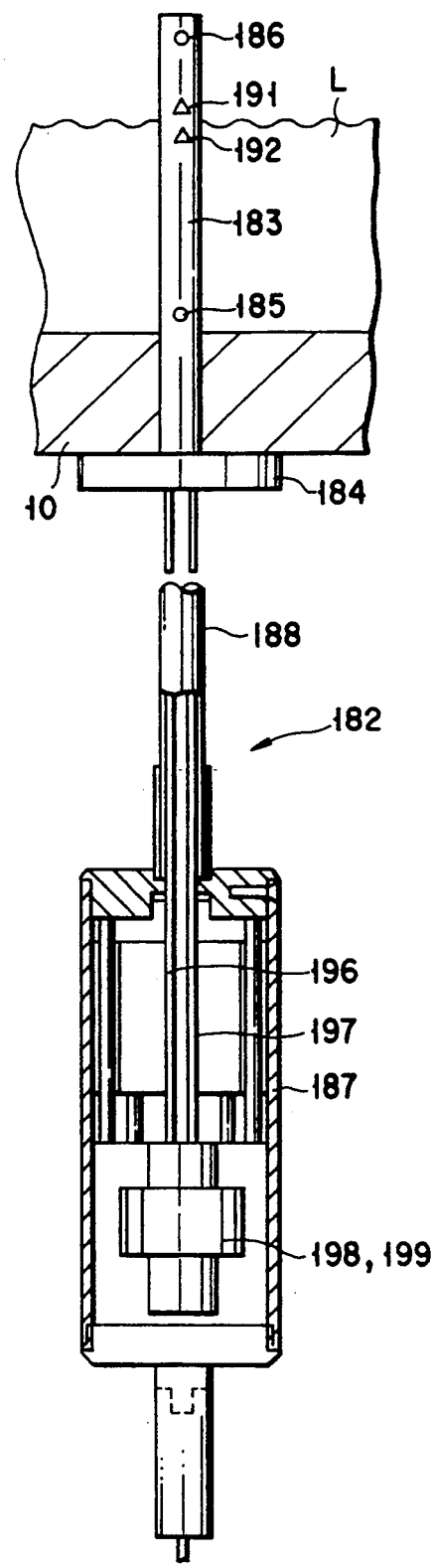
F I G. 10     F I G. 11

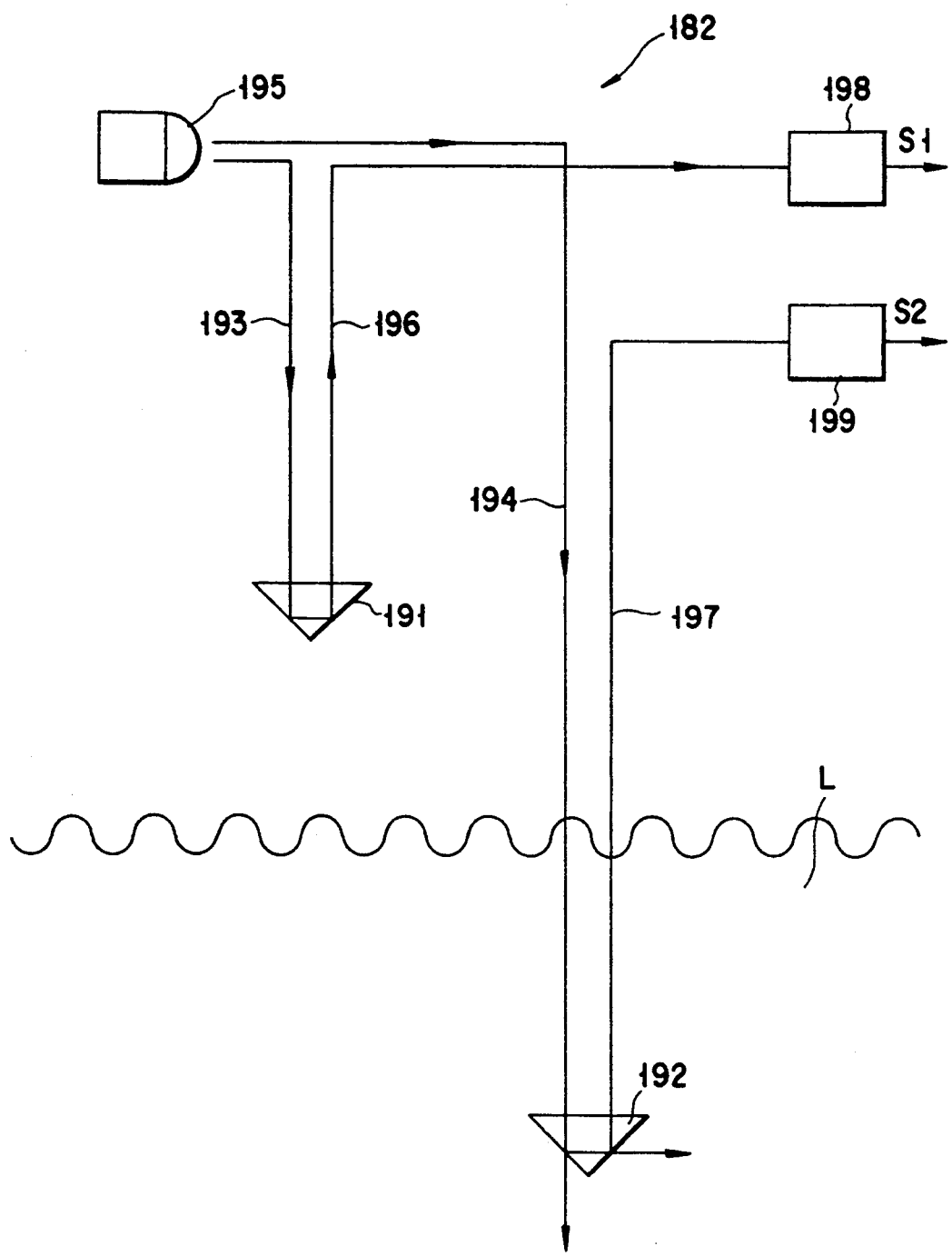
F I G. 12

PLASMA PROCESSING APPARATUS

BACKGROUND OF THE INVENTION

1. Field of the Invention

The present invention relates to a plasma processing apparatus and more particularly, an apparatus of this kind wherein the temperature adjusting section including a cooling block is arranged just under a susceptor.

2. Description of the Related Art

The plasma process such as plasma sputtering and etching is applied to semiconductor wafers in the course of manufacturing semiconductor devices.

U.S. Pat. No. 5,223,113 discloses a magnetron plasma etching apparatus. In the case of this apparatus, a process chamber serves as an upper electrode and susceptor on which each wafer is supported serves as a lower electrode. The chamber is earthed and the susceptor is connected to a high frequency power source to serve as a cathode. Process gas is introduced into the chamber and plasma is generated while applying high frequency between the electrodes. The surface of the wafer is thus etched by reactive ions and active species in the plasma.

A susceptor cooling block is arranged under the susceptor to keep the wafer on the susceptor at a cryogenic temperature of about $-150°$ C. Coolant supply and discharge pipes through which cryogenic coolant such as liquid nitrogen is circulated in the cooling block are connected to the block. The coolant supply and discharge pipes are connected to a coolant process section arranged outside the chamber. In order to use the susceptor as the cathode, as described above, the susceptor is arranged in an electric insulating frame and the cooling block is arranged under the insulating frame. When the susceptor and the cooling block are arranged in this manner, however, heat exchanging rate between them becomes insufficient to thereby lower the controllability of wafer temperature and the efficiency of using coolant.

This problem is also common to other plasma processing apparatuses wherein objects such as wafers are processed while keeping them under cryogenic temperature.

SUMMARY OF THE INVENTION

The object of the present invention is therefore to provide a plasma processing apparatus capable of increasing heat exchanging rate between the susceptor and the cooling block while keeping them electrically and thermally insulated from the process chamber.

According to an aspect of the present invention, there is provided an apparatus for plasm-processing a substrate to be processed comprising: a conductive chamber for substantially defining a space in which the substrate is processed; means for supplying a process gas, which is made into plasma, into the chamber; means for exhausting the chamber to make it vacuum; a first block, which is conductive and heat-transmitting and arranged in the chamber to support the substrate thereon; a second block, which is conductive and heat-transmitting, and arranged in the chamber, the second block being formed independently of the first block, and abutting and electrically connected to the first block, and having therein a bore in which a coolant is contained; a seal ring arranged between the first and the second block to form a hermetically sealed and enclosed clearance between them; means for supplying a heat-transmitting gas into the clearance; plasma generating means for making the process gas into plasma in the chamber while applying first potential to the chamber and second potential, different from the first one, to the first block; and joint means for connecting the second block to the chamber and defining coolant passages through which the coolant is supplied into and discharged from the bore in the second block, the joint means including a first conductive connector secured and electrically connected to the second block, a second conductive connector secured and electrically connected to the chamber, and an electrical- and thermal-insulating intermediate ring for connected the first and second connectors to each other for keeping them electrical- and thermal-insulated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a sectional view showing a cryogenic seal ring enlarged;

FIG. 7 is a perspective view showing the seal ring enlarged;

FIGS. 8A and 8B are sectional views each showing a variation of the cryogenic seal ring;

FIG. 10 is a sectional view showing the sensor enlarged;

FIG. 11 is a sectional view showing the sensor enlarged when viewed in a direction perpendicular to the direction in which the sensor in FIG. 10 is viewed; and FIG. 12 shows how the sensor is operated.

DETAILED DESCRIPTION OF THE PREFERRED EMBODIMENTS

Figure 1:
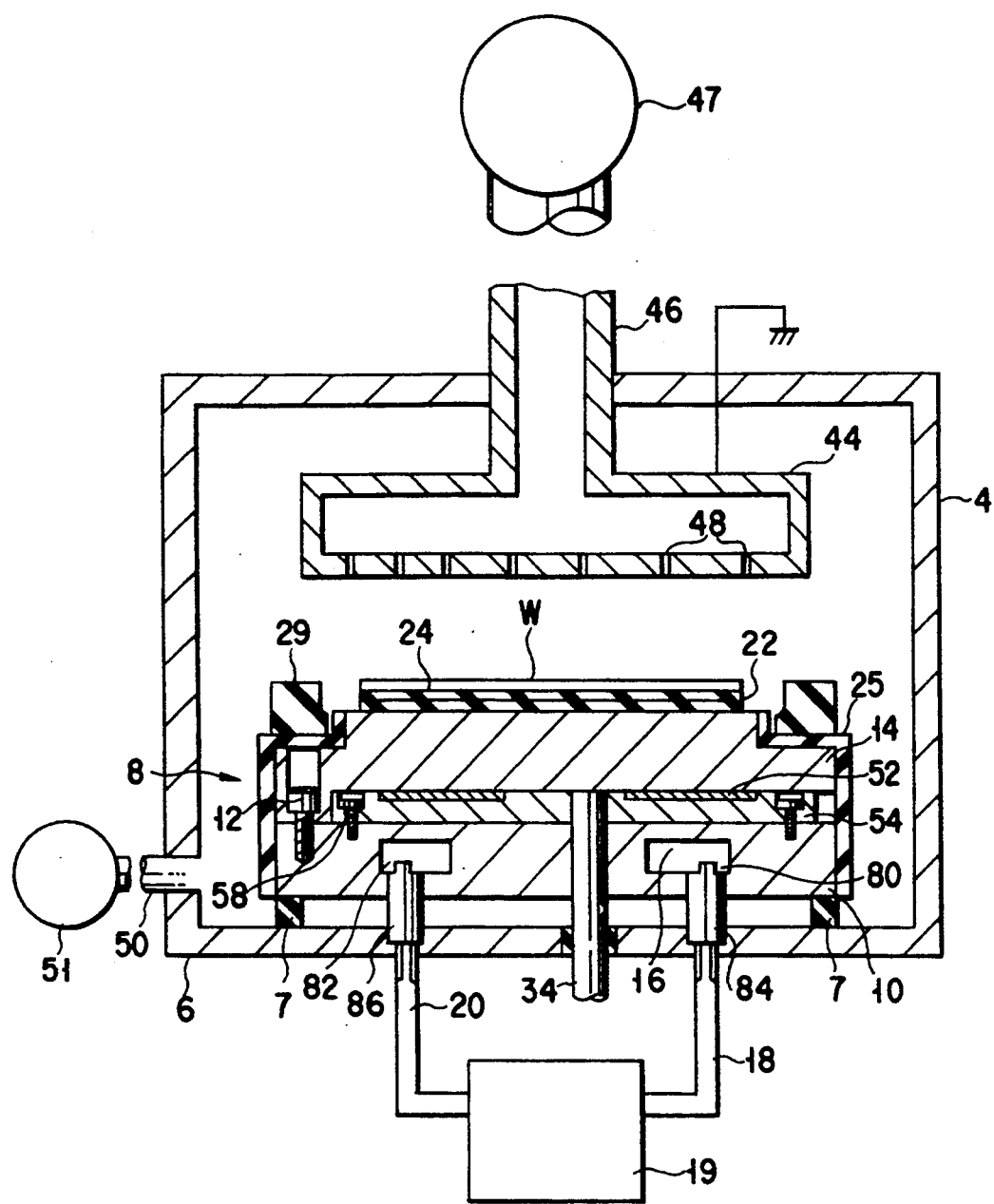
FIG. 1 is a sectional view showing the plasma processing apparatus according to an embodiment of the present invention.

In the case of a plasma processing apparatus 2 shown in FIG. 1, a process chamber 4 is made of conductive material such as aluminium and shaped like cylinder or rectangle. A column-like mount 8 on which a semiconductor wafer W, for example, to be processed is mounted is arranged on a bottom 6 of the process chamber 4 through an electrical and thermal insulator 7. The wafer-mount 8 includes a cooling block or susceptor support 10 and a susceptor 14 each made of conductive material such as aluminium having a high heat transmitting capacity and shaped like a column. The susceptor 14 is detachably attached to the block 10 by plural bolts 12.

A bore 16 in and through which coolant such as liquid of nitrogen, helium or other is caused to stay and flow is formed in the cooling block 10. Connected to the bore 16 are supply and discharge pipes 18 and 20, which are connected to a coolant process section 19 arranged outside the process chamber 4. Coolant is introduced from the process section 19 into the bore 16 through the supply pipe 18 and returned from the bore 16 into the process section 19 through the discharge pipe 20, while exchanging heat with the block 10.

Figure 2:
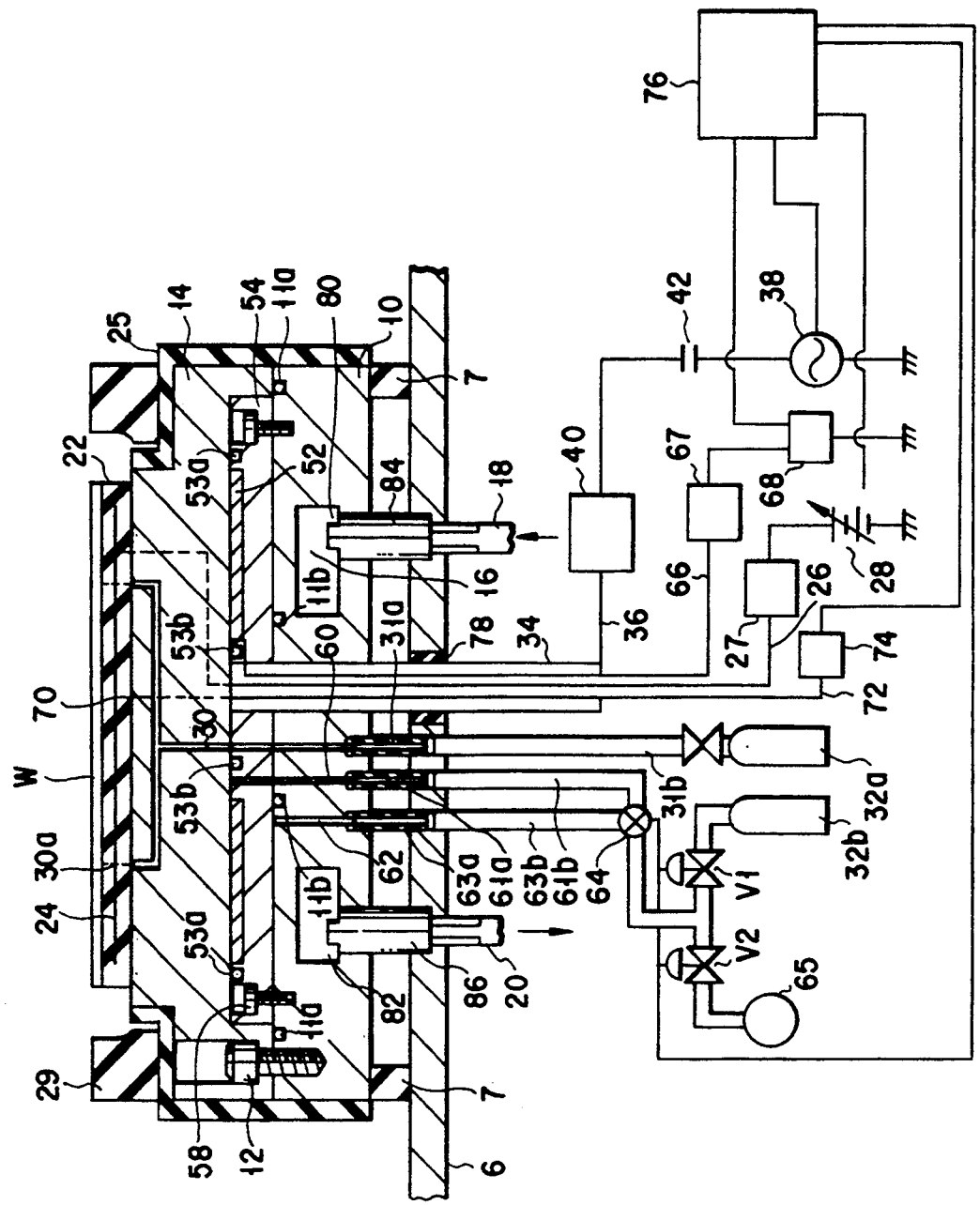
FIG. 2 is a sectional view showing in detail a wafer-mount of the plasma processing apparatus.

An electrostatic chuck 22 having substantially the same area as that of each wafer is arranged on the wafer-mount section projected from the center top of the susceptor 14. It is formed by sandwiching a conductive film 24 such as copper foil between two sheets of high-molecular polyimide film. As shown in FIG. 2, the conductive film 24 is connected to a high voltage DC source 28 through a filter 27, which serves to cut high frequencies, by a lead 26. When high voltage is applied to the conductive film 24, the wafer W is attracted by and held on the chuck 22 by coulomb force.

A conductive pipe 34 which passes through the cooling block 10 is connected to the susceptor 14. It is further connected to a high frequency power source 38 of 380 KHz, for example, by a lead 36. Plasma-generating high frequency can be thus supplied to the susceptor 14, which serves as a lower electrode. A noise cutting filter 40 and a matching condenser 42 are provided to the lead 36.

Both of the cooling block 10 and the susceptor 14 are enclosed by a cover 25 which is made of an electrical and thermal insulating material. The material of which the cover 25 is made is selected to have a thermal conductivity λ lower than 2 (W/m·K) and a dielectric constant ε lower than 5 when used. When the thermal conductivity of the cover material becomes higher than 2 (W/m·K), the heat insulating capacity of the cover 25 becomes insufficient to thereby allow a large amount of heat to come into the wafer-mount 8 at the wafer-processing time. It becomes difficult in this case to stably keep the wafer W under cryogenic temperature. When the dielectric constant thereof becomes higher than 5, the electrical insulating capacity of the cover 25 becomes insufficient under high frequency voltage to thereby allow discharge to be caused from the wafer-mount 8. It becomes difficult in this case to stably apply high frequency voltage to the susceptor 14. Inorganic materials such as quartz and borosilicate glasses and organic materials such as resins of fluorine, polyimide and polyamide-imide groups and PEEK (polyetherethylketene) can be used to make the cover 25.

A focus ring 29 is arranged on the cover 25 to enclose the wafer W on the mount 8. It is made of such material as does not attract any reactive ions and it serves to cause reactive ions to effectively enter into the wafer W which is located inside it.

An upper electrode 44 earthed is located above the electrostatic chuck 22, having a space of about 15–20 mm from the chuck 22. It is made of conductive material such as aluminium and electrically connected to the chamber 4. The chamber 4 is also thus earthed. The upper electrode 44 is connected to a process or etching gas source 47, in which $CF_4$, for example, is used as process gas, through a pipe 46. Gas is supplied under the upper electrode 44 through a plurality of apertures 48 which are formed in the bottom of the upper electrode 44.

An exhaust pump 51 is connected to the side of the process chamber 4 through a pipe 50. The process chamber 4 is set to have a predetermined vacuum atmosphere by the pump 51.

Figure 3:
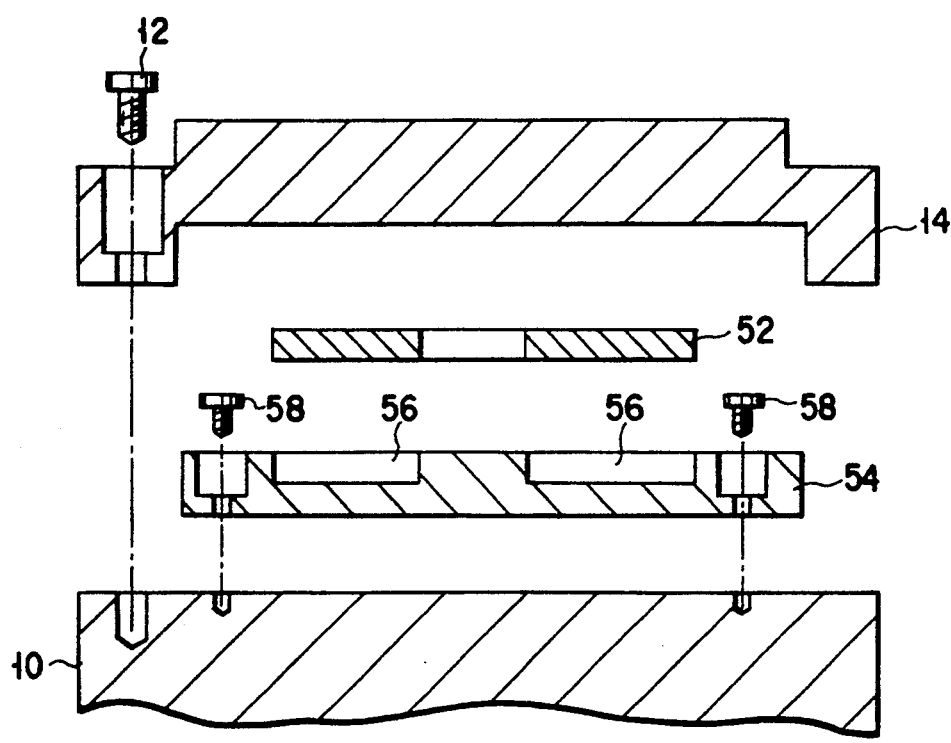
FIG. 3 is an exploded view schematically showing a part of the wafer-mount.

A ring-shaped ceramic heater 52 having a thickness of about several millimeters is arranged between the susceptor 14 and the cooling block 10. It comprises an insulating ceramic plate enclosing a heating resistor which is connected to a power source 68 through a filter 67 by a lead 66. As shown in FIG. 3, the heater is seated in a groove 56 on a fixing frame 54 attached to the top of the cooling block 10 such that the tops of the heater 52 and frame 54 are on the same level. The fixing frame 54 is made of conductive material having a high thermal conductivity such as aluminium. The diameter of the heater 52 is set substantially the same as the representative diameter of the wafer W. The heater 52 controls cold transmitted from the cooling block 10 to the wafer W to thereby adjust the temperature of the wafer W.

Through-holes (not shown) through which pusher pins pass to move the wafer W up and down are formed in both of the heater 52 and the fixing frame 54. The fixing frame 54 is detachably attached to the cooling block 10 by plural bolts 58. A recess into which the whole of the fixing frame 54 is housed is formed in the underside of the susceptor 14.

A hole 30 is communicated with a clearance between the susceptor 14 and the electrostatic chuck 22 bonded each other, passing through the susceptor 14, the fixing frame 54 and the cooling block 10. It is connected to a gas source 32a, in which a heat transmitting gas, such as He, is contained, through a pipe 31a made of electrical and thermal insulating ceramics and through a pipe 31b made of conductive material. The heat transmitting gas is supplied from the clearance between the susceptor 14 and the electrostatic chuck 22 into a clearance between the electrostatic chuck 22 and the wafer W, passing through a plurality of apertures 30a formed in the electrostatic chuck 22.

A ring groove having a diameter larger than the outer diameter of the heater 25 and another ring groove having a diameter smaller than the inner diameter of the heater 25 are formed in the top of the heater fixing frame 54. Cryogenic seal rings 53a and 53b are seated in these two ring grooves to shield a clearance between the susceptor 14 and the fixing frame 54 from process atmosphere in the chamber 4. The clearance between the susceptor 14 and the fixing frame 54 is communicated with a hole 60 which passes through the fixing frame 54 and the cooling block 10. The hole 60 is connected to a three-way valve 64 via a pipe 61a made of electrical and thermal insulating ceramics and a pipe 61b made of conductive material.

Two small- and large-diameter ring grooves are formed in the top of the cooling block 10 and cryogenic seal rings 11a and 11b are seated in these grooves to shield a clearance between the fixing frame 54 and the cooling block 10 from process atmosphere in the process chamber 4. The clearance between the fixing frame 54 and the cooling block 10 is communicated with a hole 62 formed in the cooling block 10. The hole 62 is connected to the three-way valve 64 via a pipe 63a made of electrical and thermal insulating ceramics and a pipe 63b made of conductive material.

A heat transmitting gas or He source 32b and an exhaust pump 65 are connected to the three-way valve 64 via switching valves V1 and V2. The three-way and switching valves 64, V1 and V2 are of the electromagnetic type controlled independently of the others by a control section 76.

When heat transmitting gas is supplied to the clearances between the susceptor 14 and the fixing frame 54 and between the fixing frame 54 and the cooling block 10 through the three-way valve 64 while opening the valve V1 and closing the valve V2, paths each having a higher heat transmitting capacity can be formed to exchange heat between the cooling block 10 and the susceptor 14. The susceptor 14 can be thus more efficiently cooled and this cooling of the susceptor 14 can also be made higher by the heat insulating action of the cover 25, so that the amount of coolant such as liquid nitrogen or helium consumed can be reduced to a greater extent.

When the temperature of the susceptor 14 is to be raised, the three-way valve 64 is changed over, while closing the valve V1 and opening the valve V2, to connect the exhaust pump 65 only to the clearance between the fixing frame 54 and the cooling block 10 so as to depressurize it. Most of the cooling block 10 can be thus thermal-insulated from the heater 52 to more smoothly raise the temperature of the susceptor 14 and to reduce the amount of coolant wasted to a greater extent.

When maintenance is being applied to the apparatus, the three-way valve 64 is changed over, while closing the valve V1 and opening the valve V2, to connect the exhaust pump 65 to both of clearances between the susceptor 14 and the fixing frame 54 and between the fixing frame 54 and the cooling block 10 so as to depressurize them. Most Of the cooling block 10 can be therefore thermal-insulated from the susceptor 14 to thereby reduce the amount of coolant wasted to a greater extent at the time of maintenance.

The electrostatic chuck 22 is provided with a wafer temperature sensor 70 which comprises a fluoroptic optical fiber thermometry, such as Luxtron (T.M.) available from Luxtron Corporation, or a thermocouple. A lead 72 through which sensed matters are transmitted is connected to the wafer temperature sensor 70. When Luxtron is used as the detector 70, the lead 72 is made by an optical fiber but when the thermocouple is used, it is made by a common conductor. When the thermocouple is used, it is connected to the control section 76 through a filter 74 which serves to remove high frequency noises.

The control section 76 comprises a computer, for example, which controls the whole of the apparatus according to a predetermined program stored. In short, it controls the high frequency power source 38, the power source 68 for the heater 52, and the DC power source 28 for the electrostatic chuck 22.

Those various wirings which are easily affected by plasma-generating high frequencies, that is, all of the lead 66 connected to the heater 52, the lead 26 connected to the electrostatic chuck 22, and the lead 72 connected to the temperature detector 70 are housed in the pipe 34, through which plasma-generating high frequencies are supplied, to prevent high frequency noises from being added to those components which are around the pipe 34. Further, filters 67, 27 and 74 each serving to cut high frequency noises are provided to the leads 66, 26 and 72, respectively. In addition, an insulator 78 is interposed between the pipe 34 and the bottom of the chamber 4 through which the pipe 34 passes.

Figure 4:
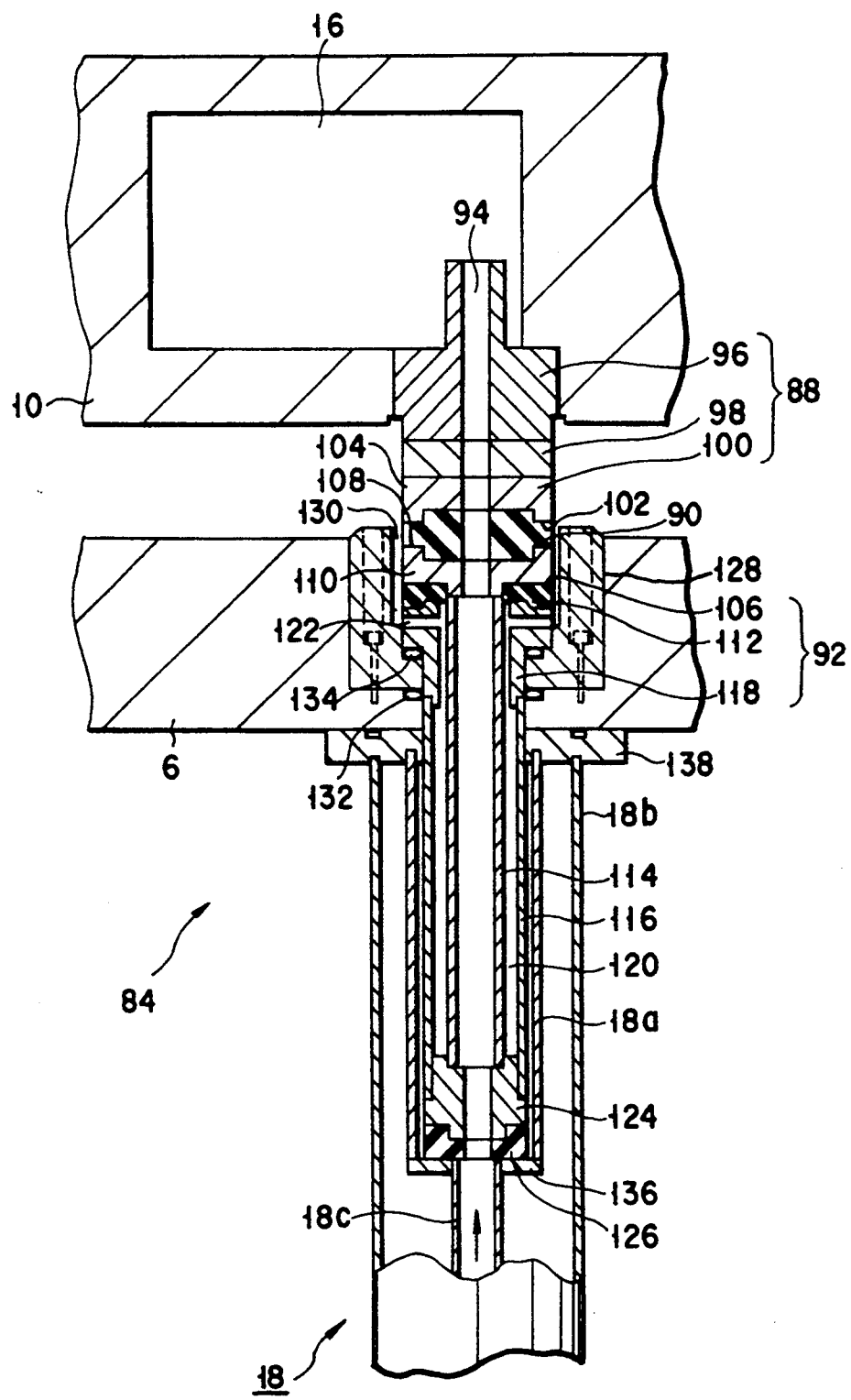
FIG. 4 is a sectional view showing a joint device used in a passage of the plasma processing apparatus through which coolant flows.

As shown in FIGS. 1 and 2, a coolant inlet 80 of the cooling block 10 is connected to a supply pipe 18 through a joint device 84 and a coolant outlet 82 of the cooling block 10 to an exhaust pipe 20 through a joint device 86. Electric insulation is established between the cooling block 10 and the process chamber 4 and coolant pipes 18 and 20, and thermal insulation is realized between coolant and the chamber bottom 6 by the joint devices 84 and 86. Although their flow path areas may be different, both of the joint devices 84 and 86 are the same in structure and in manner of attaching them to their corresponding components. Therefore, the joint device 84 shown in FIG. 4 and located on the supply side will be now described.

The joint device 84 comprises an upper connector 88 attached to the cooling block 10, a lower connector 92 connected to the supply pipe 18 and an intermediate section 90 arranged between the upper 88 and the lower connector 92. A coolant passage or path 94 is formed passing through centers of these components.

The upper connector 88 is of the tripple-layer type, comprising first, second and third rings 96, 98 and 100 successively connected in this order. The first ring 96 is made of aluminium, for example, and the whole of it is sealingly attached and fixed to the block 10, projecting its upper portion into the bore 16 in the block 10. The second ring 98 is made of stainless steel, for example. The third ring 100 is made of Kovar (T.M.), for example, available from Westinghouse Electric Corporation and consisting of 28% of Ni, 18% of Co and the remaining of Fe. It is intended to reduce stress caused when components are thermally shrunk. In place of Kovar, Super Invar (41–43% of Ni+Co, 0.7–4.25% of Mn, max. 0.3% of Si, max. 0.1 of C, and the remaining of Fe) may be used.

The intermediate section 90 connected to the third ring 100 is made of material, low in heat conductivity and high in electrical insulation, such as ceramics formed by sintering alumina or SiN, for example. Insulation relative to high frequencies and thermal insulation relative to liquid nitrogen can be achieved by the intermediate section 90.

As the first and second rings 96 and 98 are made of aluminium and stainless steel, they are connected to each other by friction welding, for example. The second and third rings 98 and 100 are connected to each other by electron beam welding, for example, because they are made of stainless steel and Kovar. The third ring 100 and the intermediate section 90 are connected to each other by vacuum braze welding in which a brazing material consisting of silver and copper, for example, is used. In this case, the face of alumina, a representative material for the intermediate section 90, which is contacted with the third ring 100 is coated and metalized with metal paste, for example, in advance. When treated in this manner, its wetting and its contact with the third Kovar-made ring 100 can be made better.

A ring-shaped recess 102 is formed on the top of the intermediate section 90 along the outer rim thereof. A ring-shaped projection 104 formed on the underside of the third ring 100 along the outer rim thereof is seated on the ring-shaped recess 102 of the intermediate section 90 to prevent these section 90 and ring 100 from being shifted from their axis when they are connected to each other.

The third ring 100 is made of such material that has a coefficient of linear expansion falling in a range between those of the upper connector 88 and the intermediate section 90. This is intended to reduce stress caused when these components are thermally shrunk. The above-mentioned Kovar can be cited as material having such coefficient of linear expansion as ranked between those of stainless steel and ceramics, for example.

In the case of this example, diameters of the upper connector 88, the intermediate section 90 and the lower connector 92 are set about 30 mm, those of flow paths in their centers about 6 mm and the thickness of the intermediate section 90 about 10 mm. When arranged in this manner, although the pressure of liquid nitrogen supplied is 3 kgf/mm$^2$, a tensile strength larger than 9.1 kgf/mm$^2$ can be obtained at the jointed portion of the first and second rings 96 and 98, and a tensile strength larger than 9.0 kgf/mm$^2$ at the jointed portion of the third ring 100 and the intermediate section 90, while a tensile strength at the jointed portion of the second and third rings 98 and 100 can be more than 60 kgf/mm$^2$.

The lower connector 92 includes a fourth ring 106 at the top thereof and this fourth ring 106 made of Kovar, for example, is intended to reduce stress caused when components are thermally shrunk. It is connected to the intermediate section 90 by the above-mentioned braze welding. A ring-shaped recess 108 is formed on the underside of the intermediate section 90 along the outer rim thereof and a ring-shaped projection 110 on the top of the fourth ring 106 is fitted onto the ring-shaped recess 108 of the intermediate section 90 to thereby prevent these fourth ring 106 and the intermediate section 90 from being shifted from their center axis when they are connected to each other.

A fifth ring 112 is located under the fourth ring 106. It is made of thermal insulating material such as alumina ceramics and teflon and it is intended to assist heat insulation between the upper 88 and the lower connector 92.

Inner and outer pipes 114 and 116 of the double-pipe type are coaxially located also under the fourth ring 106. They are made of material such as stainless steel, for example, having such a high mechanical strength as does not cause any of them to be broken by impact. Their lower ends are fixed by a coupler 124 made of stainless steel, for example, and having a flow path in the center thereof.

The top end of the inner pipe 114 is connected to the fourth ring 106 by butt welding, for example. The top of the outer pipe 116 is connected to a T-piece 118 made of stainless steel, for example. The T-piece 118 is provided with passages 122 through which a ring-shaped spaced 120 formed between the inner 114 and the outer pipe 116 can be communicated with the inside to the process chamber 4. When the chamber 4 is made vacuum at the time of plasma process, therefore, the space 120 is also made vacuum to thereby heat-insulate the inside of the inner pipe 114 from outside.

The lower connector 92 of the joint device is loosely housed in a support 128, which is fixed to a recess in the chamber bottom by bolts, for example. A ring-shaped flow path 130 through which the inside of the chamber 4 can be communicated with the passages 122 is formed between the inner circumference of the support 128 and the outer circumference of the joint device. Air and heat insulating O-rings 132 and 134 are arranged at those portions of the T-piece 118, which are contacted with the chamber bottom 6 and the support 128, so as to prevent air from being ventilated with outside.

The supply pipe 18 made of stainless steel, for example, is also of the double-pipe type. Inner and outer pipes 18a and 18b are connected to the chamber bottom 6 through a flange 138. The inner pipe 18a encloses the lower end portion of the joint device and it is connected, below the lower end of the joint device, to another smaller-diameter inner pipe 18c through an end plate 136. A teflon-made seal ring 126 is interposed between the coupler 124 at the lower end of the joint device and the end plate 136 of the inner pipe 18a. Coolant such as liquid nitrogen is introduced into the inner pipe 114 in the joint device through the inner pipes 18c and 18a.

The third and fourth rings 100 and 106 made of Kovar which sandwich the ceramics-made intermediate section 90 of the joint device between them are firmly connected to the intermediate section 90 by braze welding. When the stainless-steel-made second ring 98 and inner pipe 114 are connected to the ceramics-made intermediate section 90 through the Kovar-made third and fourth rings 100 and 106 which have a coefficient of linear expansion ranked between those of stainless steel and ceramics, stress caused by the thermal shrinkage of these components at the time of coolant supply can be reduced to a greater extent and the jointed strength of them can be kept higher than a practically reliable level.

The space between the inner 114 and the outer pipe 116 is communicated with the inside of the process chamber 4 and depressurized together with it. Heat transmission caused by the convection between the inner pipe 114, which is contacted directly with coolant, and the outer pipe 116 can be reduced to a greater extent. The coupler 124 located under the lower ends of the inner and outer pipes 114 and 116 is contacted directly with coolant, thereby allowing cold to be transmitted to the lower end portion of the outer pipe 116 through it. However, temperature gradient is caused in the vertical direction in the outer pipe 116. Cold transmitted to the upper end portion of the outer pipe 116 can be thus made quite little.

Accordingly, heat insulating capacity between coolant and the chamber bottom 6 can be increased to a greater extent by the whole of the above-described joint devices. Tests actually conducted tell that the difference between coolant temperature and the temperature of the chamber bottom 6 could be kept larger than about 100° C. The above-described joint device is quite useful particularly for those plasma processing apparatuses in which wafers are plasma-processed under temperatures lower than −50° C., particularly lower than −150° C.

Figure 5:
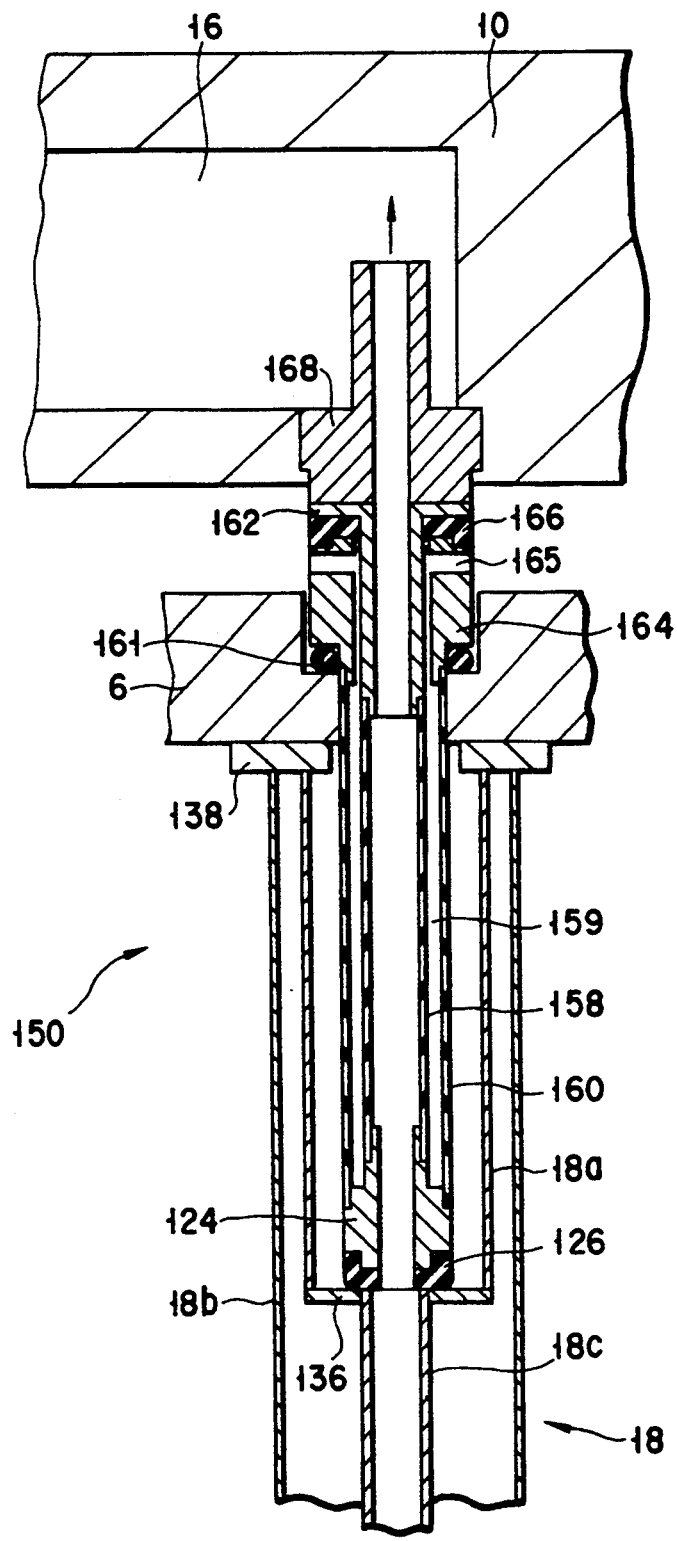
FIG. 5 is a sectional view showing a variation of the joint device used in the passage of the plasma processing apparatus through which coolant flows.

FIG. 5 shows another joint device 152 which can be used instead of the above-described joint devices 84 and 86. The components corresponding to those in the above cases will be represented by the same reference symbols and described only when needed.

The joint device 152 includes inner and outer pipes 158 and 160 of the double-pipe type. These pipes 158 and 160 coaxially arranged with each other are made of electrical insulating material such as alumina ceramics, lower in heat conductivity and smaller in coefficient of thermal expansion, as compared with metal material such as stainless steel. Their lower ends are fixed by the coupler 124 which is made of stainless steel and which has a flow path in the center thereof.

A flange 162 is connected to the top of the inner pipe 158 and a T-piece 164 located under the flange 162 is connected to the top of the outer pipe 160. The flange 162 and the T-piece 164 are made of stainless steel, for example. An electrical and thermal insulating teflon-made ring 166 is interposed between the flange 162 and the T-piece 164 to realize electrical and thermal insulation between them.

An upper connector 168 made of aluminum, for example, is connected to the top of the flange 162. It is sealingly attached and fixed to the cooling block 10, projecting its upper end portion into the bores 16 in the cooling block 10.

Formed in the T-piece 164 are passages 165, through which a space 159 between the inner and outer pipes 158 and 160 can be communicated with the inside of the chamber 4 to allow both of them to be depressurized together. Heat transmission caused by convection between the inner pipe 158, which is contacted directly with coolant, and the outer pipe 160 can be thus reduced to a greater extent.

The T-piece 164 is fitted and positioned in a recess in the chamber bottom 6. An insulating O-ring 161 is interposed between the T-piece 164 and the recess of the chamber bottom 6.

According to the above-described joint device 152, insulation can be realized between the cooling block 10 and the process chamber 4 and coolant pipes 18 and 20, and thermal insulation can also be realized between coolant and the chamber bottom 6, as seen in the case of the joint devices 84 and 86.

FIGS. 6 and 7 are sectional and perspective views showing the above-mentioned cryogenic seal ring 11a enlarged. The other seal rings 11b, 53a and 53b are substantially the same in structure as the seal ring 11a, although different in dimension, and the seal ring 11a will be therefore described as typical one of them.

A clearance S, about 0.1 mm wide, formed among the cooling block 10, the susceptor 14 and the heater fixing frame 54 to appropriately stay heat transmitting gas such as He therein. The seal ring 11a is housed in a ring-shaped groove 172, rectangular in section and formed in the top of the cooling block 10. The seal ring 11a and the groove 172 are set to have such dimensions that allow the top and bottom of the seal ring 11a to be contacted with the cooling block 10 and the susceptor 14.

The seals ring 11a includes a ring-shaped main body 174 having a flexible structure of C-shaped cross section, and a coating film 176 formed on the surface of the main body 174. Since process gas used is corrosive, materials high in corrosion resistance and elasticity, such as high class stainless steel, e.g. SUS 316 and SUS in 300s, and nickel/cobalt alloys, e.g. Inconel (T.M.) and Hastelloy (T.M.), can be used as the main body 174. Any other materials, so high in elastic modulus and yield point as to guarantee a high elastic modulus even under lower temperature, may be used.

Metal materials such as indium (In), gold (Au), silver (Ag), zinc (Zn), copper (Cu), lead (Pb), and their alloy, and high molecular materials such as Teflon and high molecular polyethylene, high in ductility and malleability, can be used as the coating film 176. When the coating film 176 of this kind is formed on the surface of the main body 174, the fitting of the seal ring 11a relative to the surfaces of those members with which the seal ring 11a is contacted can be made better, so that its sealing capacity cannot be degraded even under the cryogenic temperature of about $-150°$ C. The coating film 176 may be formed only on those portions of the main body 174 which are contacted with its corresponding members. In the case of the seal ring 11a shown in FIGS. 6 and 7, the coating film 176 is applied not to the inner face of the main body 174 but only to the outer face thereof.

The seal ring 11a is fastened with a force smaller than 10 kgf/cm$^2$ by an appropriate number of bolts. The average surface unevenness of the groove 172 is set lower than 0.2 $\mu$m (max. height: 0.8 $\mu$m) and Vickers hardnesses of the aluminum-made cooling block 10 and susceptor 14 are set lower than Hv70 in this case. The fastening force per a unit length in the case of the seal ring 11a is by far smaller, as compared with those of conventional metal seals. This enables the number of bolts used to be reduced.

For the sake of simplicity, FIG. 2 shows seal rings arranged only at typical positions, but they can be used at all of those jointed portions of components which must be sealed under cryogenic temperatures. They are usually at about twenty positions in the plasma-etching apparatus.

FIGS. 8A and 8B show variations of the cryogenic seal ring. The seal ring shown in FIG. 8A has a cross section of fallen 8 whose one end is cut away. The seal ring shown in FIG. 8B has a cross section is E-shape, in which a bent portion 178 is added to the back of the seal ring shown in FIG. 8A.

Materials of the main body 174 and the coating film 176 of the seal rings shown in FIGS. 8A and 8B are the same as in the case of the seal ring 11a shown in FIGS. 6 and 7. According to each variation, it is contacted up and down with its corresponding components at two points, respectively, so that its sealing capacity can be increased to a greater extent.

Figure 9:
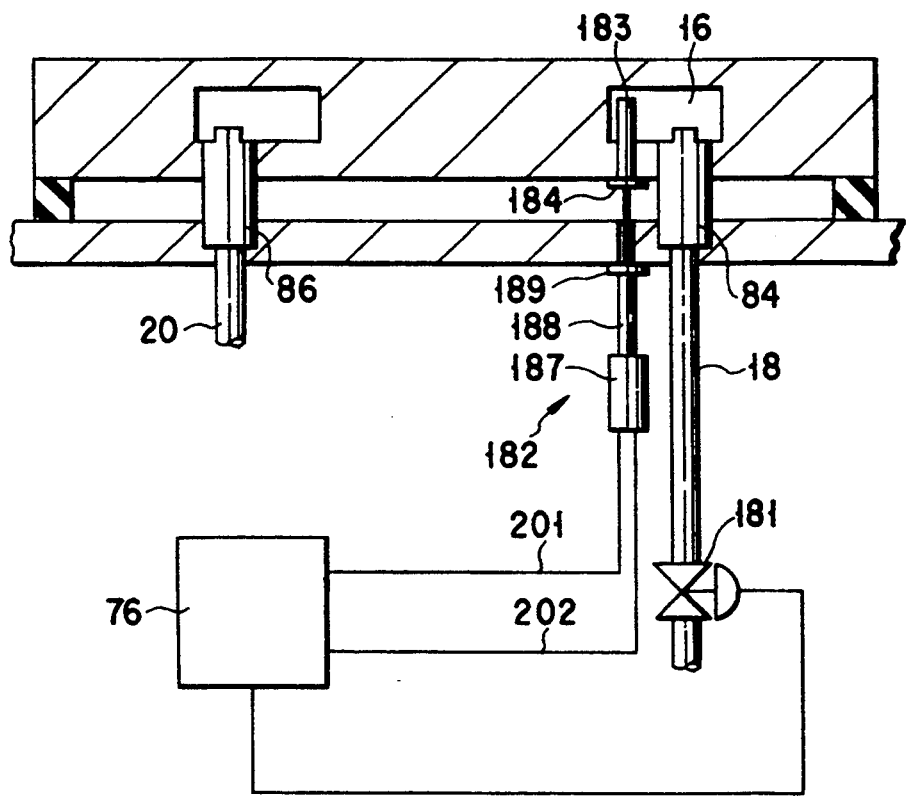
FIG. 9 schematically shows a sensor for detecting the liquid level of coolant and a mechanism for controlling the level of coolant.

FIG. 9 schematically shows a sensor 182 for detecting the liquid level of coolant L such as a liquid nitrogen in the cooling block 10, and a mechanism for controlling the level of coolant L. A detecting terminal of the sensor covered by a stainless-steel-made protection pipe 183 is attached to the cooling block 10 by a flange 184, projecting into the bore 16 in the block 10. A sensor body 187 is arranged below the chamber bottom 6 and a stainless-steel-made protection pipe 188 attached to the body 187 at the lower end thereof is also attached to the chamber bottom 6 by a flange 189 at the upper end thereof.

As shown in FIGS. 10 through 12, the pipe 183 projected into the bore 16 in the cooling block 10 is provided with a hole 185 through which coolant is introduced into the pipe 183, and with another hole 186 through which coolant gas vaporized in the pipe 183 is returned into the bore 16. First and second prisms 191 and 192 are arranged in the pipe 183, corresponding to upper and lower limit levels of coolant in the bore 16. They are 90° prisms which serve to pass incident light beams through them or to reflect incident light beams, depending upon differences of their refractive indexes relative to the refractive index of atmosphere surrounding them.

The sensor body 183 is connected to the first and second prisms 191 and 192 via four optical fibers 193, 194, 196 and 197. These optical fibers extend from the first and second prisms 191 and 192 and pass through the pipe 183, and then through the flange 184 under such a condition that they are sealed by cryogenic temperature- and pressure-resistant adhesive. They then pass through the space between the cooling block 10 and the chamber bottom 6 such that they are not covered. Further, they pass through holes in the chamber bottom 6, and then through the flange 189 such that they are sealed by pressure-resistant adhesive. And they cone into the sensor body 187, passing through the pipe 188.

Only the optical fibers of the sensor 182, which are electrical insulators extend between the cooling block 10 and the chamber bottom 6. Electrical insulation can be thus realized between the block 10 and the bottom 6.

Light-emitting diodes 195 are arranged in the sensor body 187 and light beams are shot from the diodes 195 to the prisms 191 and 192 through the optical fibers 193 and 104. Light beams reflected by the prisms 191 and 192 are returned to the sensor body 187 through the optical fibers 196 and 197. The first and second prisms 191 and 192 are arranged in the pipe 183 such that their vertical angles of 90° are kept top and that their faces opposed to their vertical angles are kept horizontal. The optical fibers 193 and 194 are arranged to allow light beams to vertically enter into the horizontal faces of the prisms 191 and 192, while the other optical fibers 196 and 197 to allow light beams, which are reflected by the prisms 191 and 192, to enter into them.

Light beams reflected by the first and second prisms 191 and 192 and returned to the sensor 187 are received by first and second light-receiving elements 198 and 199. Light-receiving signals S1 and S2 applied from the first and second light-receiving elements 198 and 199 are transmitted to the control section 76 via leads 201 and 202, as shown in FIG. 9. Responsive to signals S1 and S2 thus transmitted, the control section 76 opens and closes an electromagnetic valve 181 on the coolant supply pipe 18.

When the liquid level of coolant L such as liquid nitrogen in the bore 16 lowers gradually and becomes lower than the second prism 192, atmosphere around the second prism 192 changes from liquid to vapor-phase. Difference between refractive indexes of the second prism 192 and the vapor-phase coolant is quite large. Therefore, light beam which enters into the second prism 192 through the optical fiber 194 is totally and internally reflected twice by the interface between the second prism 192 and the vapor-phase coolant. This reflected light beam is received through the optical fiber 197 by the second light-receiving element 199. Light beam thus received is converted into electric signal in the second light-receiving element 199 and transmitted as signal S2 to the control section 76. The control section 76 opens the electromagnetic valve 181 responsive to signal S2 thus received, thereby supplying coolant into the bore 16 in the cooling block 10 through supply pipe 18.

The first prism 19 is still in the vapor-phase atmosphere under this state. Light beam incident on the first prism 191 is thus reflected by the first prism 191 and received by the first light-receiving element 198. Therefore, signal S1 is transmitted from the first light-receiving element 198 to the control section 76.

When coolant is supplied into the bore 16, its liquid level rises in the bore 16 and the second prism 192 is again immersed in liquid-phase coolant. Difference between refractive indexes of the second prisms 192 and the liquid-phase coolant is small. Therefore, light beam entering through optical fiber 194 is not totally and internally reflected by the interface between the second prism 192 and the liquid-phase coolant, but allowed to pass into coolant L. This causes the second light-receiving element 199 not to receive any light beam reflected by the second prism 192, thereby stopping transmitting of signal S2. However, the electromagnetic valve 181 has a self-maintaining circuit. Even after the transmitting of signal S2 is stopped, therefore, the electromagnetic valve 181 can be kept open to thereby continue the supply of coolant into the bore 16.

When coolant is further supplied into the bore 16 and the liquid level of coolant in the bore 16 comes over the first prism 191, any light beam is not reflected by the first prism 191 and the transmitting of signal S1 from the first light-receiving element 198 is stopped. When the transmitting of signal S1 is thus stopped, the control section 76 releases the self-maintaining circuit of the electromagnetic valve 181 to thereby close the valve 181. The supply of coolant into the bore 16 is thus stopped.

If a third 90° prism cooperates with the first and second prisms to confirm whether or not the liquid level of coolant is at a predetermined position, the level of coolant can be more accurately controlled.

It will be now described how the above-described plasma etching apparatus is operated.

The process chamber 4 is depressurized to a predetermined pressure or $1 \times 10^{-4}$—several Torr. The wafer W is carried from the load lock chamber (not shown) into the process chamber 4 and mounted on the susceptor 14 in the chamber 4. The wafer W is then attracted and held on the susceptor 14 by the electrostatic chuck 22. Process gas is introduced from the upper electrode 44 into the chamber 4 while applying high frequency to the susceptor 14. Plasma is thus generated. The etching process of the wafer w is started using ions and active species in the plasma.

Since the wafer W is heated higher than a predetermined temperature by the heat of the plasma, the wafer W has to be cooled. A coolant such as liquid nitrogen is circulated in the cooling block 10 to keep this block 10 at a temperature of about $-196°$ C. Cold is supplied from the block 10 to the wafer W through the susceptor 14 to cool the wafer W.

By adjusting the amount of heat added by the heater 52, cold transmitted to the wafer w can be adjusted to keep the wafer W at a predetermined temperature or about $-150°$ C., for example. Conventionally, wafer temperature is controlled by controlling the temperature of coolant itself. Further, in the conventional apparatuses, distance between the cooling block and the wafer is large and interfaces along which components are joined with one another are numerous. These cause the heat response of the conventional apparatuses to be made quite low. In the case of the present invention, however, the cooling block 10 can be kept at a certain low temperature and the heater 52 is neared the wafer W until only a distance of 15–20 mm is left between them. Therefore, any change in the amount of heat added by the heater 52 can be more quickly reflected in the temperature of the wafer W. This enables wafer temperature to be more quickly controlled.

When wafer temperature cooled only by liquid nitrogen while keeping the heater 52 inoperative, that is, $-160°$ C., for example, (the difference of liquid nitrogen temperature $-196°$ C. relative to this temperature $-160°$ C. is caused by temperature loss through the susceptor and others) is made the lowest temperature value, it can be more quickly and linearly controlled within a temperature range of from the lowest temperature value to a room temperature value. When it is to be raised as described above, temperature can be more efficiently set by exhausting the clearance between the cooling block 10 and the heater fixing frame 54 by the pump 65. Further, temperature control can also be conducted only by the heater 52 while stopping the supply of liquid nitrogen. Heat transmitting gas such as He is introduced into the clearance between the heater 52 and the susceptor 14 and to the underside of the wafer W to thereby increase the coefficient of heat transfer.

High frequencies passing through the pipe 34 are transmitted along the peripheral portion of the pipe 34 due to skin effect. Those leads 26, 66 and 72 of various kinds which are affected by high frequencies to generate inducing noises B are housed in the pipe 34 and they include high frequency noise cutting filters 27, 67 and 74. Therefore, noises can be prevented from adding undesirable effects to the control system.

The susceptor which is easily damaged by plasma can be more easily detached from the cooling block 10 and exchanged with new one. The heater 52 can also be easily detached from under the susceptor 14 and exchanged with new one.

Pipes for connecting the process chamber 4 to the wafer-mount 8 including the cooling block 10 and the susceptor 14 have electrical insulating means such as the joint devices 84, 86, the short pipes 31a, 61a, 63a, the insulator 78 and others, as described above. The joint devices 84 and 86 also serves to heat-insulate the coolant pipes 18, 20, the cooling block 10 and the chamber bottom 6.

The present invention has been described, citing the plasma etching apparatus, but it can also be applied to other plasma apparatuses, such as CVD, ashing and sputtering apparatuses.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An apparatus for plasma-processing a substrate to be processed comprising:
   a conductive chamber for substantially defining a space in which the substrate is processed;
   means for supplying a process gas, which is made into plasma, into the chamber;
   means for exhausting the chamber to make it vacuum;
   a first block, which is conductive and heat-transmitting, and arranged in the chamber to support the substrate thereon;
   a second block, which is conductive and heat-transmitting, and arranged in the chamber, the second block being formed independently of the first block, and abutting and electrically connected to the first block and having therein a bore in which a coolant is contained;
   a seal ring arranged between the first and the second block to form a hermetically sealed and enclosed clearance between them;
   means for supplying a heat-transmitting gas into the clearance;
   plasma generating means for making the process gas into plasma in the chamber while applying first potential to the chamber and second potential, different from the first one, to the first block; and
   joint means for connecting the second block to the chamber and defining coolant passages through which the coolant is supplied into and discharged from the bore in the second block, the joint means including a first conductive connector secured and electrically connected to the second block, a second conductive connector secured and electrically connected to the chamber, and an electrical- and thermal-insulating intermediate ring for connected the first and second connectors to each other for keeping them electrical-and thermal-insulated.

2. The apparatus according to claim 1, further comprising an electrostatic chuck sheet which is arranged on the first block and on which the substrate is mounted.

3. The apparatus according to claim 2, further comprising means for applying a heat transmitting gas between the electrostatic chuck sheet and the substrate.

4. The apparatus according to claim 3, further comprising a heater arranged between the bore in the second block and the electrostatic chuck sheet to control the amount of cold transmitted from the coolant in the bore to the substrate on the electrostatic chuck sheet.

5. The apparatus according to claim 4, wherein the heater comprises a ceramic heater having a heating resistor.

6. The apparatus according to claim 2, wherein the plasma generating means includes a high frequency power source connected to the second block and the second potential is applied from the high frequency power source.

7. The apparatus according to claim 6, wherein the plasma generating means includes means for earthing the chamber and the first potential is earthed potential.

8. The apparatus according to claim 1, further comprising exhaust means connected to the clearance between the first and the second block to selectively make the clearance vacuum.

9. The apparatus according to claim 1, further comprising a cover for enclosing the first and second blocks, the cover being made of such a material that has a thermal conductivity smaller than 2 (W/m·K) and a dielectric constant smaller than 5.

10. The apparatus according to claim 9, wherein the cover is made of the material selected from a group consisting of quartz glass, borosilicate glass, resins of fluorine, polyimide and polyamideimide groups, and PEEK.

11. The apparatus according to claim 1, further comprising a sensor for measuring the liquid level of the coolant, which is a liquefied gas, and means for controlling the liquid level of the coolant, wherein said sensor includes first and second optical elements arranged at upper and lower limit positions of the liquid level, respectively, to pass and reflect incident light beams through and by them, depending upon differences of their refractive indexes relative to those of atmosphere surrounding them, first and second optical fibers through which light beams shot from light-emitting means are transmitted to the first and second optical elements, respectively, and third and fourth optical fibers through which light beams reflected by the first and second optical elements are transmitted to first and second light-receiving elements, respectively, and wherein said control means starts the supply of the coolant into the bore in the second block, responsive to a signal applied and representing that the second light-receiving element begins to receive light beam, and it stops the supply of coolant into the bore, responsive to a signal applied and representing that the first light-receiving element stops receiving light beam.

12. The apparatus according to claim 11, wherein said first and second optical elements are 90° prisms.

13. An apparatus for plasma-processing a substrate to be processed comprising:

conductive chamber for substantially defining a space in which the substrate is processed;

means for supplying a process gas, which is made into plasma, into the chamber;

means for exhausting the chamber to make it vacuum;

a first block, which is conductive and heat-transmitting, and arranged in the chamber to support the substrate thereon;

second block, which is conductive and heat-transmitting, and arranged in the chamber, the second block being formed independently of the first block, and abutting and electrically connected to the first block and having a bore in which a coolant is contained;

a seal ring arranged between the first and the second block to form a hermetically sealed and enclosed clearance between them;

means for supplying a heat-transmitting gas into the clearance;

plasma generating means for making the process gas into plasma in the chamber while applying first potential to the chamber and second potential, different from the first one, to the first block; and joint means for connecting said second block to the chamber and defining coolant passages through which the coolant is supplied into and discharged from the bore in the second block, the joint means including a first conductive connector secured and electrically connected to the second block, a second conductive connector secured and electrically connected to the chamber, an electrical- and thermal-insulating intermediate ring for connecting the first and second connectors to each other while keeping them electrical- and thermal-insulated, inner and outer pipes located nearer the chamber than the intermediate ring and formed in double-pipe structure to form a ring-shaped gap between them, and a ring arranged at the lower ends of the inner and outer pipes to close the ring-shaped gap between the pipes, the inner pipe defining a coolant passage therein and the ring-shaped gap between the pipes being formed to communicate with an inside of the chamber.

14. The apparatus according to claim 13, wherein the inner and outer pipes are made of conductive material and formed as a part of the second connector.

15. The apparatus according to claim 14, wherein the first connector includes a first buffer ring arranged at part connected to the intermediate ring to reduce stress caused by thermal shrinkage, and the first buffer ring has a coefficient of linear expansion falling in a range between those of a material constituting the intermediate ring and a material constituting other part of the first connector arranged adjacent to the first buffer ring.

16. The apparatus according to claim 15, wherein the second connector includes a second buffer ring arranged at part connected to said intermediate ring to reduce stress caused by thermal shrinkage, and the second buffer ring has coefficient of linear expansion falling in a range between a those of the material constituting the intermediate ring and a material constituting other part of the second connector arranged adjacent to the second buffer ring.

17. The apparatus according to claim 13, wherein the inner and outer pipes are made of insulating material and the inner pipe is connected to the first connector while the outer pipe to the second connector.

18. An apparatus for plasma-processing a substrate to be processed comprising:

conductive chamber for substantially defining a space in which the substrate is processed;

means for supplying a process gas, which is made into plasma, into the chamber;

means for exhausting the chamber to make it vacuum;

a first block, which is conductive and heat-transmitting, and arranged in the chamber to support the substrate thereon;

a second block, which is conductive and heat-transmitting, and arranged in the chamber, the second block being formed independently of the first block, and abutting and electrically connected to the first block, and having a bore in which a coolant is stayed;

a seal ring arranged between the first and the second block to form a hermetically sealed and enclosed clearance between them, the seal ring including a pipe-shaped main body and a coating film formed on the outer surface of the main body, the main body being made of such a material that has a high elastic coefficient even under low temperature and that is selected from a group consisting of stainless steel and nickel/cobalt alloy, and the coating film being made of such a material that has a high ductility and malleability and that is selected from a group consisting of indium, gold, silver, zinc, copper, lead, and their alloy, and teflon and high molecular polyethylene;

means for supplying a heat-transmitting gas into the clearance;

plasma generating means for making the process gas into plasma in the chamber while applying first potential to the chamber and second potential, different from the first one, to the first block; and joint means for connecting the second block to the chamber and defining coolant passages through which the coolant is supplied into and discharged from the bore in the second block, the joint means including a first conductive connector secured and electrically connected to the second block, a second conductive connector secured and electrically connected to the chamber, and an electrical- and thermal-insulating intermediate ring for connecting the first and second connectors to each other for keeping them electrical- and thermal-insulated.

19. The apparatus according to claim 18, wherein the main body comprises a pipe-structure having a C-shaped cross section.

20. The apparatus according to claim 18, wherein the main body comprises a pipe-structure having a fallen-8-shaped cross section whose one end is cut away.

21. The apparatus according to claim 18, wherein the main body comprises a pipe-structure having an E-shaped cross section.

* * * * *